(12) United States Patent
Noda

(10) Patent No.: US 7,141,816 B2
(45) Date of Patent: Nov. 28, 2006

(54) FIELD EFFECT TRANSISTOR

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/840,319

(22) Filed: May 6, 2004

(65) Prior Publication Data

US 2004/0251504 A1  Dec. 16, 2004

(30) Foreign Application Priority Data

May 7, 2003   (JP)  ............... 2003-128861

(51) Int. Cl.
   H01L 29/06    (2006.01)
   H01L 31/072   (2006.01)
   H01L 31/109   (2006.01)
   H01L 31/0328  (2006.01)
   H01L 31/0336  (2006.01)

(52) U.S. Cl. ......................................... 257/24; 257/27

(58) Field of Classification Search ................. 257/24, 257/25, 30, 37; 25/27

See application file for complete search history.

(56) References Cited

U.S. PATENT DOCUMENTS 5,731,598 A * 3/1998 Kado et al. .................... 257/30
5,856,681 A * 1/1999 Ohshima ....................... 257/25
6,358,437 B1   3/2002 Jonas et al.

FOREIGN PATENT DOCUMENTS

| WO | WO 01/99208 A2   | 12/2001 |
| WO | WO 02/071496 A1  | 9/2002  |
| WO | WO 03/023954 A1  | 4/2003  |
| WO | WO 2004/001855 A1| 12/2003 |

* cited by examiner

*Primary Examiner*—Hoai Pham
(74) *Attorney, Agent, or Firm*—Wolf, Greenfield, & Sacks, P.C.

(57) ABSTRACT

A field effect transistor comprises, at least, a channel forming region formed in a semiconductor layer, and a gate electrode provided in face-to-face relation with the channel forming region via a gate insulating film, wherein the semiconductor layer is made of a mixture of a semiconductor material layer and conductive particles. The field effect transistor is capable of enhancing a carrier mobility.

1 Claim, 8 Drawing Sheets

FIELD EFFECT TRANSISTOR

BACKGROUND OF THE INVENTION

This invention relates to a field effect transistor and a method for manufacturing the same.

Field effect transistors (FET) including thin film transistors (TFT) that have now been used in a variety of electronic appliances are constituted, for example, of a channel-forming region and source/drain regions formed on a silicon semiconductor substrate or silicone semiconductor layer, a gate insulating layer formed on the surface of the silicon semiconductor substrate or silicone semiconductor layer and made of $SiO_2$, and a gate electrode provided in face-to-face relation with the channel-forming region through the gate insulating film. Alternatively, the transistor may be constituted of a gate electrode formed on a substrate, a gate insulating layer formed on the substrate including the gate electrode, and a channel-forming region and source/drain regions formed on the gate insulating layer. For the manufacture of the field effect transistors having such structures, a very expensive semiconductor apparatus has been in use, and thus the reduction of manufacturing costs has been strongly demanded.

In order to meet the demand, attention has been recently made to studies and developments of FET using organic semiconductor materials, with which FET can be manufactured based on methods such as a spin coating method, a printing method, a spraying method, without resorting to vacuum techniques.

FET is required to exhibit high-speed operations because of the requirement of being assembled in many electronic appliances including displays. For instance, FET necessary for this purpose is such that video signals are converted to data as occasion arises and switching operations of on/off can be performed at high speed.

Where organic semiconductor materials are used, the mobility that is a characteristic index of TFT, for example, is obtained as a typical value which is as low as $10^{-3}$ to 1 $cm^2/Vs$ (see, for example, C. D. Dimitrapopoulos, et at., Adv. Mater. (2002), 14. 99). This value is lower than several $cm^2/Vs$ of the mobility of amorphous silicon or about 100 $cm^2/Vs$ of the mobility of polysilicon, and thus does not arrives at such a mobility of 1 to 3 $cm^2/Vs$ as required for TFT for displays. Accordingly, FET using organic semiconductor materials has a great problem on how to improve mobility.

The mobility of FET using an organic semiconductor material is determined depending on the intramolecular charge transfer and the intermolecular charge transfer. The intramolecular charge transfer becomes possible when atomic orbitals are superposed between adjacent multiple bonds sandwiching a single bond so that electrons are non-localized to form a conjugated system. The intermolecular charge transfer is realized through conduction resulting from the superposition of molecular orbitals caused by intermolecular bond or van der Waals' force or the hopping conduction through an intermolecular trapping level.

In this case, when the intramolecular mobility is taken as $\mu_{intra}$, the mobility of intermolecular bond taken as $\mu_{inter}$, and the mobility based on the intermolecular hopping conduction taken as $\mu_{hop}$, the following relationship is established.

$$\mu_{intra} >> \mu_{inter} > \mu_{hop}$$

With organic semiconductor materials, the mobility is limited, as a whole, with the slow intermolecular charge transfer, so that the mobility of charge is small.

In order to improve the mobility of FET using organic semiconductor materials, studies have been extensively made.

For instance, where a pentacene thin film which is a kind of organic semiconductor material is formed according to a vacuum deposition technique, the deposition rate during the deposition is suppressed to an extreme extent and the substrate temperature is set at room temperature thereby improving orientation of molecules and arriving at a mobility of 0.6 $cm^2/Vs$ (see C. D. Dimitrakopoulos et at., IBM J. Res & Dev. (2001), 45, 11). This method aims at improving the mobility by improving the crystallinity of material and suppressing the intramolecular hopping conduction. Although the mobility is improved, the intramolecular movement limits the mobility as a whole like other types of organic semiconductor materials. Eventually, such a great mobility as to be satisfied cannot be achieved.

For an organic semiconductor transistor positively using intramolecular charge transfer, a self-assembled monolayer field-effect transistor (SAMFET) of Luscent Technology Inc., has been proposed. In this device, a semiconductor layer made of a monolayer is formed between a source electrode and a drain electrode through self-assembling thereby realizing SAMFET having a gate length of 15 nm. In this SAMFET, the channel-forming region is constituted of the monolayer that is oriented along the direction of connecting the source electrode and the drain electrode, so that the charge transfer within the channel-forming region is limited only to the intramolecular movement. As a consequence, a mobility of 290 $cm^2/Vs$ that is higher than that of polysilicon has been achieved (see J. H. Schoen et al., Nature (2001), 413, 713; Appl. Phys. Lett (2002), 80, 847). However, such a channel structure has a gate length which is determined depending on the thickness of the monolayer film, so that the gate length becomes so short as several nanometers. This brings about the problem that the pressure resistant between the source and drain regions becomes low, not making it possible to achieve a high drive voltage. For the formation of electrodes on the monolayer film without breakage of the monolayer film, the substrate temperature should be cooled down to $-172°$ C. to $-30°$ C., and thus process costs become high. Thus, this process has little practical merits.

A channel material using a blend of organic and inorganic materials has been proposed in Japanese Patent Laid-open No. 2000-260999. More particularly, while, in the technique disclosed in Japanese Patent Laid-open No. 2000-260999, a layer structure is formed of an inorganic component and an organic component to utilize the high carrier mobility characteristic of the inorganic crystalline solid on one hand and the ability of the organic component assisting in self-assembling of the inorganic material on the other hand, deposition of the material on a substrate under low temperature processing conditions is enabled. Although a mobility of 1 to 100 $cm^2/Vs$ has been expected, the mobility actually achieved is as low as 0.25 $cm^2/Vs$. This value is higher than that of an organic semiconductor material generally formed according to a spin coating technique, and is at the same level as that of an organic semiconductor material formed by vacuum deposition or the like. The mobility higher than that achieved by amorphous silicon has never been obtained.

SUMMARY OF THE INVENTION

It is accordingly an object of the invention to provide a field effect transistor which enables a carrier mobility to be drastically increased over field effect transistors using known organic semiconductor materials.

It is another object of the invention to provide a method for manufacturing such a field effect transistor of the type mentioned above.

The above objects can be achieved, according to the invention, by a field effect transistor which comprises, at least: (a) a channel region formed in a semiconductor layer, and (b) a gate electrode provided in face-to-face relation with the channel forming region through a gate insulating film, wherein the semiconductor layer is made of a mixture of a semiconductor material layer and conductive particles.

In the field effect transistor of the invention, it is preferred that source/drain regions are so formed as to sandwich the channel forming region therebetween in the semiconductor layer.

It is also preferred in the field effect transistor of the invention that the semiconductor material layer has a form of islands, and the semiconductor layer has a structure wherein the conductive particles act to bridge gaps among the islands of the semiconductor material layer.

A method for manufacturing a field effect transistor according to a first embodiment of the invention is a manufacturing method of a so-called bottom gate-type field effect transistor, which comprises the steps of:(a) forming a gate electrode on a substrate; (b) forming a gate insulating film over the substrate including the gate electrode; and (c) forming, on the gate insulating film, a semiconductor layer constituting, at least, a channel forming region, wherein the semiconductor layer is made of a mixture of the semiconductor material layer and conductive particles.

In the manufacturing method of the field effect transistor according to the first embodiment of the invention, source/drain regions may be formed so as to sandwich the channel forming region therebeween in the semiconductor layer in the step (c).

In the manufacturing method of the invention, it is preferred that islands of the semiconductor material layer are formed on the gate insulating layer, and the conductive particles are formed as intermediaries among the islands of the semiconductor material layer in the step (c). It is also preferred that the conductive particles are formed on the gate insulating layer and subsequently islands of the semiconductor material layer are formed so that the conductive particles serve as intermediaries among the islands.

A method for manufacturing a field effect transistor according to a second embodiment of the invention is a manufacturing method of a so-called top gate-type field effect transistor, which comprises the steps of: (a) forming, on a substrate, a semiconductor layer constituting, at least, a channel forming region; (b) forming a gate insulating layer on the semiconductor layer; and (c) forming a gate electrode on the gate insulating layer, wherein the semiconductor layer is made of a mixture of a semiconductor material layer and conductive particles.

In the manufacturing method of a field effect transistor according to the second embodiment of the invention, it is preferred that source/drain regions are formed in the semiconductor layer to sandwich the channel forming region therebeween in the step (a).

It is also preferred that islands of the semiconductor material layer are formed on the substrate and subsequently the conductive particles are formed in the step (a) so as to act as intermediaries among the islands of the semiconductor material layer. Likewise, it is preferred that the conductive particles are formed on the substrate and islands of the semiconductor material layer are formed in the step (a) so that the conductive particles serve as intermediaries among the islands.

In the field effect transistor of the invention, and the manufacturing method of the field effect transistor according to the first or second embodiment of the invention (which may be generically referred to simply as invention), the term "semiconductor material layer" means a layer having a volume resistivity on the order of from $10^{-4}$ $\Omega \cdot m$($10^{-6}$ $\Omega \cdot cm$) to $10^{12}$ $\Omega \cdot m$($10^{10}$ $\Omega \cdot cm$). The term "conductive particles" means particles having a volume resistivity on the order of not higher than $10^{12}$ $\Omega \cdot m$($10^{10}$ $\Omega \cdot cm$). So far as the semiconductor layer is concerned, it may have a mixed structure of the semiconductor material layer and conductive particles wherein chemical bonding between the semiconductor material layer and the conductive particles is unnecessary.

In the practice of the invention, the semiconductor material layer should preferably be made of organic semiconductor materials. Examples of the organic semiconductor material include 2,3,6,7-dibenzoanthracene (also called pentacene), $C_9S_9$ (benzo[1,2-c;3,4-c';5,6-c"]tris[1,2]dithiol-1,4,7-trithione), $C_{24}H_{14}S_6$ (alpha-sexithiophene), phthalocyanines typically including copper phthalocyanine, fullerene ($C_{60}$), tetrathiotetracene ($C_{18}H_8S_4$), tetraselenotetracene ($C_{16}H_8Se_4$), tetratellurutetracene $C_{18}H_8Te_4$), poly(3,4-ethylenedioxythiophene)/polystyrenesulfonate [PEDOT/PSS], and the like. It will be noted that the semiconductor material layer may be constituted of an inorganic semiconductor material in the practice of the invention, and specific examples of the inorganic semiconductor material include Si, Ge, Se, and AgCl.

In the invention, the islands of the semiconductor material layer may be formed by any of methods including: physical vapor deposition methods (PVD methods) such as a vacuum deposition method, a sputtering method and the like; various chemical vapor deposition methods (CVD methods); spin coating methods; printing methods such a screen printing method, an ink jet printing method and the like; coating methods such as an air doctor coating method, a blade coating method, a rod coating method, a knife coating method, a squeeze coating method, a reverse roll coating method, a transfer roll coating method, a gravure coating method, a kiss coating method, a cast coating method, a spray coating method, a slit orifice coating method, and a calender coating method; and a spraying method.

In the practice of the invention, conductive particles may be constituted of inorganic materials. Examples of the inorganic material include metals such as platinum (Pt), gold (Au), palladium (Pd), chromium (Cr), nickel (Ni), aluminium (Al), silver (Ag), tantalum (Ta), tungsten (W), copper (Cu) and the like, and alloys of these metals. Alternatively, the conductive particles may be formed of organic materials. Examples of the organic material include carbon (preferably graphite), carbon nano tubes, carbon nano fibers, poly(3,4-ethylenedioxythiophene)/polystyreneslfonate [PEDOT/PSS]. As a matter of course, the conductive particles may be formed of mixtures of the organic materials and inorganic materials, both indicated above. Where the organic semiconductor material used to form a semiconductor material layer is of a p-type (hole conduction), it is preferred to constitute the conductive particles out of a conductive material having a great work function, i.e. it is preferred that the Fermi level of a material for the conductive particles does not arrive at the energy level at the upper end of the valance band of a p-type semiconductor. In contrast, where an organic semiconductor material for the semiconductor material layer is of an n type (electron conduction), it is preferred to constitute the conductive particles out of a conductive material having a small work function, i.e. it is preferred that the Fermi level of the material for the conductive particles exceeds the energy level at the lower end of the conduction band of the n-type semiconductor. It is to be noted that for the formation of conductive particles, any of those methods may be used including: PVD methods such as a vacuum deposition method and a sputtering method; various CVD methods; spin coating methods; printing methods such as a screen printing method and a ink jet printing method; such coating methods as mentioned hereinabove; and spraying methods.

The materials for the gate insulating layer used in the present invention include not only inorganic insulating materials such as $SiO_2$, SiN, spin-on-glass (SOG) and highly dielectric metal oxides, but also organic insulating materials such as polymethyl methacrylate (PMMA) and polyvinylphenol (PVP) and the combination thereof. For a method of forming the gate insulating film, mention is made of those methods including: PVD methods such as a vacuum deposition method and a sputtering method; various CVD methods; spin coating methods; printing methods such as a screen printing method and a ink jet printing method; such coating methods as mentioned hereinabove; dipping methods; casting methods; and spraying methods.

The materials for the gate electrode, source/drain electrodes and various wirings used in the present invention include, for example, a metal such as platinum (Pt), gold (Au), palladium (Pd), chromium (Cr), nickel (Ni), aluminium (Al), silver (Ag), tantalum (Ta), tungsten (W), copper (Cu), alloys of these metals, and conductive particles made of the metals indicated above and the alloys containing the metals. These electrodes and wirings may have a layered structure containing such a metal or alloy as mentioned above. For the materials for the gate electrode and the source/drain electrode, mention may be further made of organic materials such as poly(3,4-ethylenedioxythiophene)/polystyreneslfonate [PEDOT/PSS]. For a method of forming the gate electrode, source/drain electrodes and wirings, mention is made of any of methods including: PVD methods such as a vacuum deposition method and a sputtering method; various CVD methods; spin coating methods; printing methods such as a screen printing method, and a ink jet printing method; such coating methods as mentioned hereinabove; liftoff methods; shadow mask methods; and spraying methods.

In the practice of the invention, various substrates may be used including different types of glass substrates, quartz substrates, silicon substrates and the like. Alternatively, plastic films, plastic sheets and plastic substrates made, for example, of polymer materials such as polyether sulfone (PES), polyimides, polycarbonates, and polyethylene terephthalates (PET) may be likewise used as the substrate. If a flexible substrate constituted of such a polymer material as indicated above is used, it would become possible to assemble or integrally incorporate a field effect transistor, for example, in curved displays or electronic appliances.

In the invention, since the semiconductor layer constituting a channel forming region has a mixed structure of a semiconductor material layer and conductive particles, the mobility of carriers can be drastically increased in comparison with the conventional case using organic semiconductor materials alone.

BRIEF DESCRIPTION OF THE PREFERRED EMBODIMENTS

The embodiments of the invention are described with reference to the accompanying drawings.

Embodiment 1

Embodiment 1 relates to a field effect transistor (hereinafter referred to simply as FET) and also to a method for manufacturing a field effect transistor (hereinafter referred to as method for manufacturing FET) according to a first embodiment of the invention.

Figure 4:
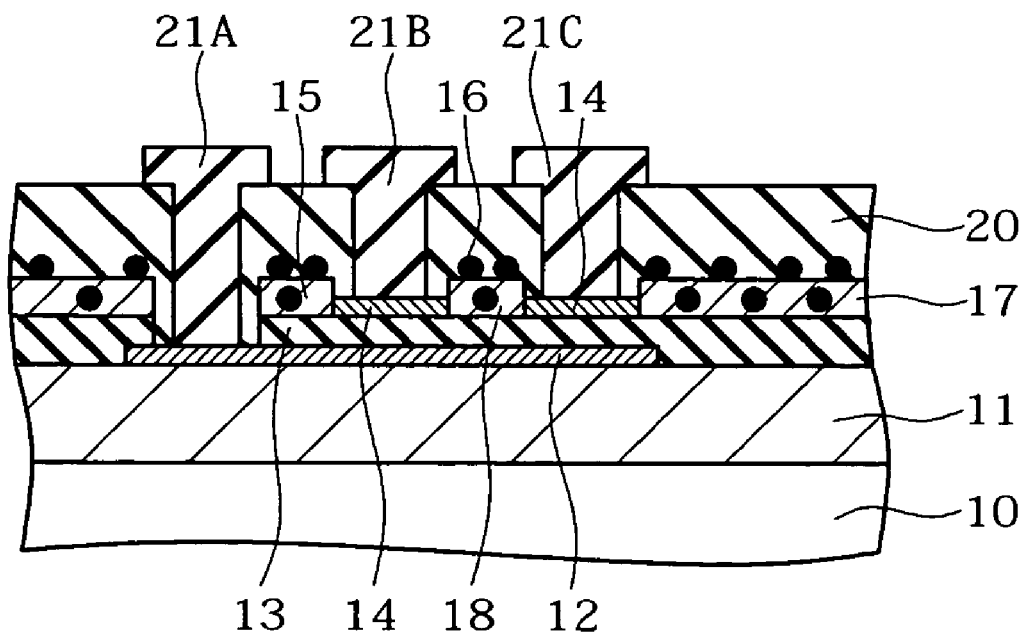
FIG. 4 is a schematic, partial section of the support and other layers for illustrating the manufacturing method of the field transistor subsequent to FIG. 3B.
Figure 5A:
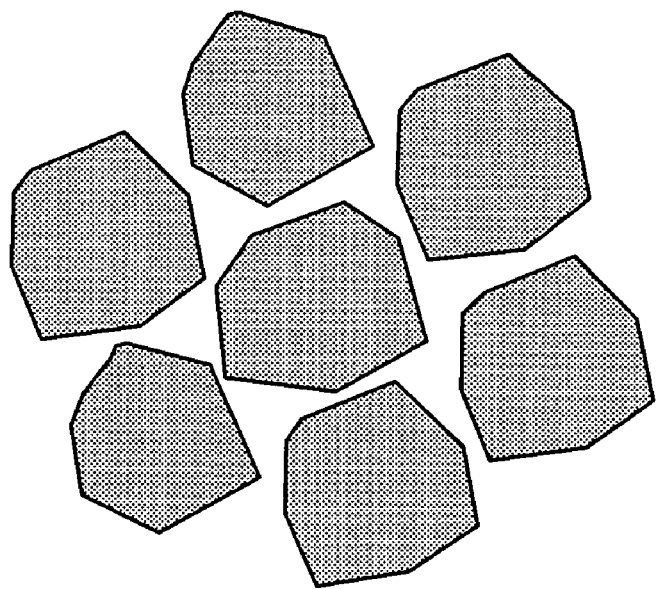
FIGS. 5A and 5B are a schematic plan view showing islands of a semiconductor material layer and a schematic plan view showing conductive particles acting as intermediaries for the islands of the semiconductor material layer, respectively.
Figure 5B:
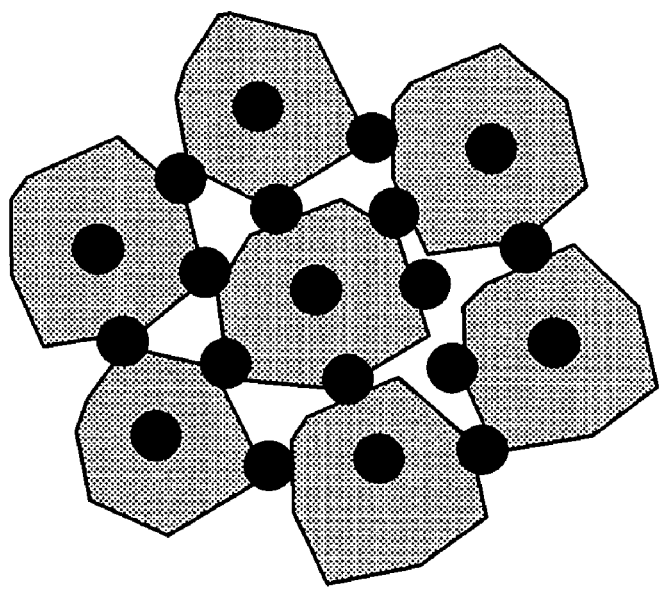

The FET of Embodiment 1 is FET of a so-called bottom gate type as is schematically shown in FIG. 4 that is a partial sectional view, and has, at least, a channel forming region 18 formed in a semiconductor layer 17 and a gate electrode 12 provided via a gate insulating layer 13 in face-to-face relation with the channel-forming region 18. The semiconductor layer 17 is made of a semiconductor material layer 15 and conductive particles 16 being mixed with each other. More particularly, as schematically shown in FIG. 5B, the semiconductor material layer 15 is formed as islands, and the semiconductor layer 17 has a structure wherein the conductive particles 16 act as intermediaries among the islands of the semiconductor material layer 15 or bridge gaps among the islands.

In Embodiment 1, the semiconductor material layer 15 is formed of an organic semiconductor material, e.g. 2,3,6,7-dibenzoanthracene (which may be called pentacene), and the conductive particles 16 are made of an inorganic material, e. g. platinum (Pt).

The manufacturing method of FET according to Embodiment 1 is described with reference to FIGS. 1A to 1D, FIGS.

Figure 3A:
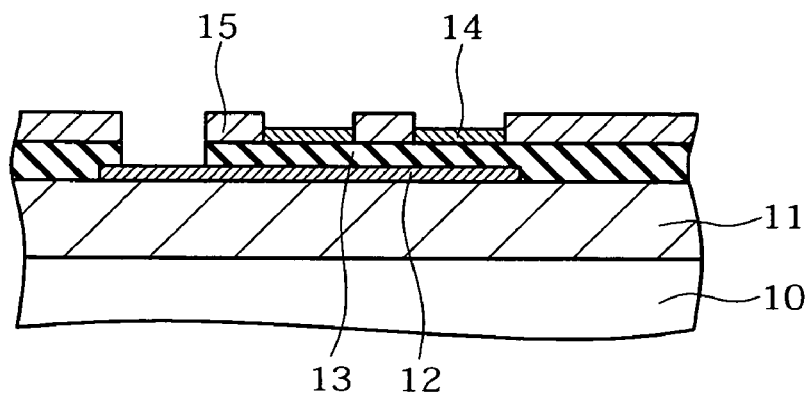
FIGS. 3A and 3B are, respectively, a schematic view, partially in section, of the support and other layers for illustrating the manufacturing method of the field transistor subsequent to FIG. 2C.
Figure 3B:
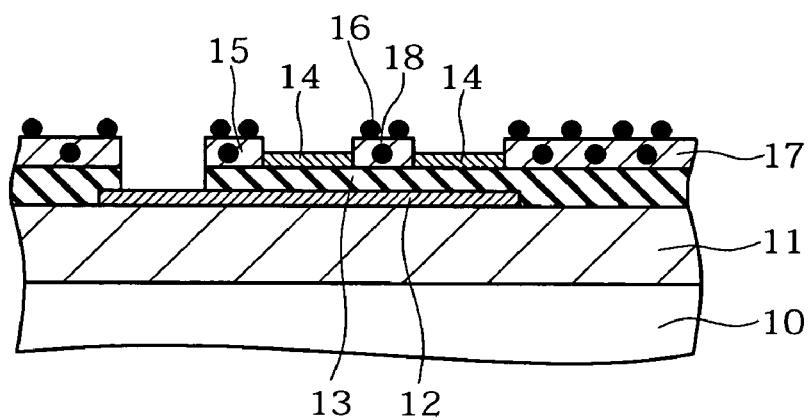

2A to 2C, FIG. 3A and 3B and FIG. 4, which are each a schematic view, partially in section, of the support and other layers.

[Step-100]

Initially, a gate electrode is formed on a substrate. More particularly, a substrate 11 made of polyether sulfone (PES) bonded to a support 10 made of a silicon substrate is formed thereon with a pattern for forming a gate electrode by use of a resist layer 31 (see FIG. 1A).

Next, a Ti layer serving as an adhesion layer and an Au layer serving as a gate electrode 12 are, respectively, formed on the substrate 11 and the resist layer 31 according to a vacuum deposition method (see FIG. 1B)). In the figure, the adhesion layer is not shown. When the vacuum deposition is carried out, the support 10 to which the substrate 11 is bonded is mounted on a support holder capable of controlling the temperature, so that the rise of the support temperature can be suppressed in the course of the vacuum deposition. Thus, the layers can be formed by the vacuum deposition while minimizing the deformation of the substrate 11.

Figure 1A:
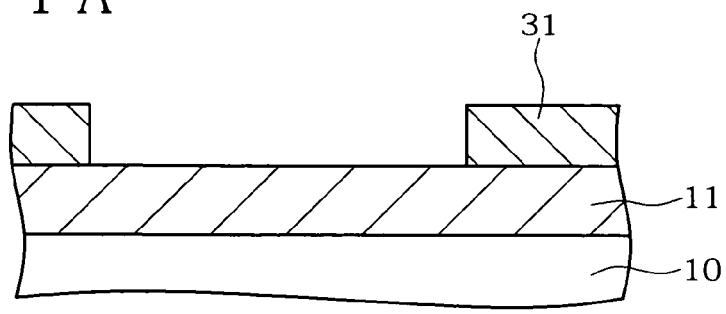
FIGS. 1A to 1D are, respectively, a schematic view, partially in section, of a support and other layers for illustrating a method of manufacturing a field effect transistor according to Embodiment 1 of the invention.
Figure 1B:
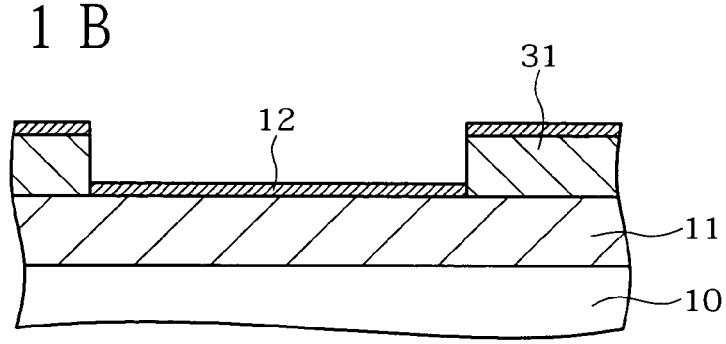
Figure 1C:
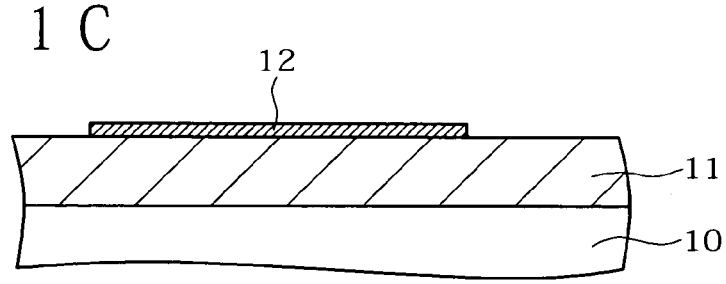
Figure 1D:
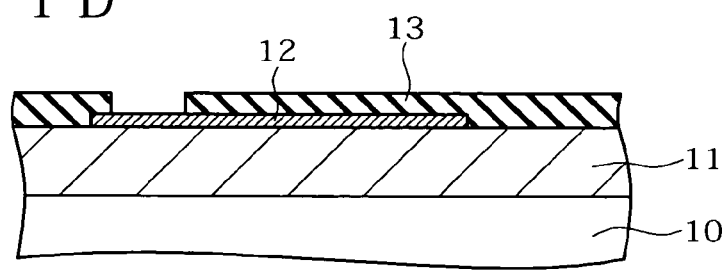

Thereafter, the resist layer 31 is removed according to a lift-off method to obtain the gate electrode 12 (see FIG. 1C).

[Step-110]

Next, a gate insulating layer 13 is formed on the substrate 11 including the surface of the gate electrode 12. More particularly, the gate insulating layer 13 made of $SiO_2$ is formed on the gate electrode 12 and the substrate 11 according to a sputtering method. Upon the formation of the gate insulating layer 13, if part of the gate electrode 12 is covered with a hard mask, a lead portion of the gate electrode can be formed without resorting to a photolithographic process. When the gate insulating layer 13 is formed, the support 10 to which the substrate 11 has been bonded is mounted on the support holder capable of controlling temperature. Thus, the support temperature can be suppressed from being increased in the course of the formation of $SiO_2$ and the deformation of the substrate can be minimized during the layer formation.

[Step-120]

Figure 2A:
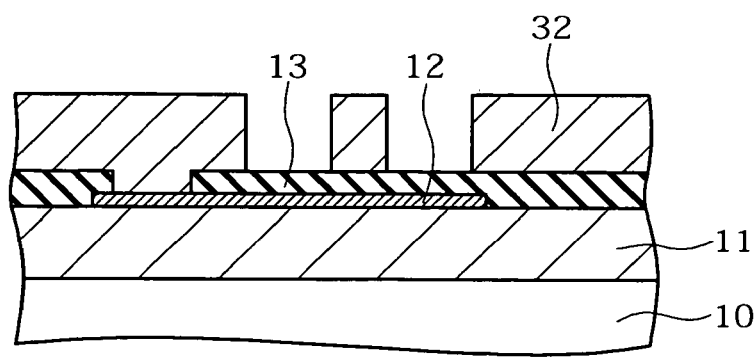
FIGS. 2A to 2C are, respectively, a schematic view, partially in section, of the support and other layers for illustrating the manufacturing method of the field transistor subsequent to FIG. 1D.

Thereafter, source/drain electrodes 14 are formed on the gate insulating layer 13, respectively. More particularly, a pattern used to form the source/drain electrodes is formed using a resist layer 32 (see FIG. 2A).

Figure 2B:
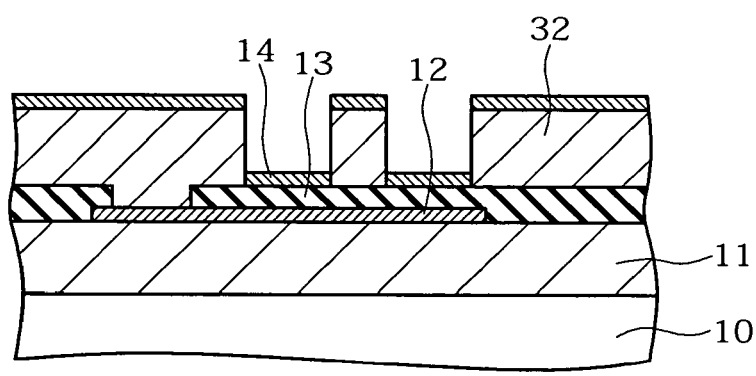

Next, the Ti layer serving as an adhesion layer and the Au layer serving as the source/drain electrodes 14 are formed on the gate insulating layer 13 and the resist layer 32 according to a vacuum deposition method (see FIG. 2B). In the figure, the adhesion layer is not shown. Upon the vacuum deposition, the support 10, to which the substrate 11 has been bonded, is mounted on the support holder capable of controlling temperature, and thus the rise of the support temperature in the course of the vacuum deposition can be suppressed. Eventually, the deformation of the substrate 11 can be minimized for the layer formation.

Figure 2C:
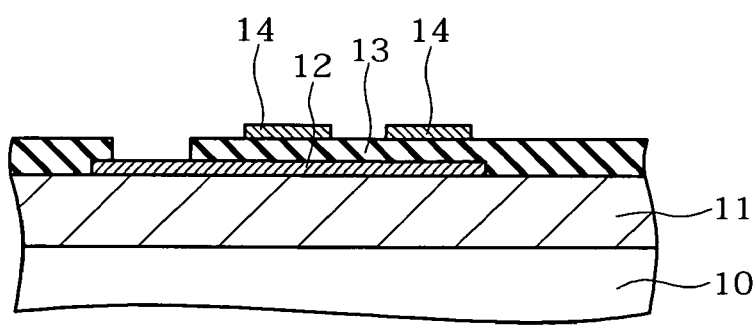

Thereafter, the resist film 32 is removed by a liftoff method to provide the source/drain electrodes 14 (see FIG. 2C).

Next, a semiconductor layer 17 is formed on the gate insulating layer 13 according to the following procedures of [Step-130] and [Step-140].

[Step-130]

While covering part of the gate electrode 12 and the source/drain electrodes 14 with a hard mask, an organic semiconductor material of pentacene is formed on the gate insulating film 13 according to a vacuum deposition method (see FIG. 3A). The deposition of pentacene is carried out such that since the support, bonded with the substrate 11 thereon, is mounted on the support holder capable of controlling temperature, the support temperature in the course of the vacuum deposition can be reliably controlled to a desired level. Under these conditions, islands of the semiconductor material layer 15 (i.e. an islands-shaped pentacene thin film) can be formed wherein its grain size is great, a distance between the grains is large and crystallinity is good (see the schematic plan view of FIG. 5A). The forming conditions of the pentacene thin film are indicated in Table 1 below.

TABLE 1

| [Film-forming conditions] | |
|---|---|
| Support temperature: | 0 to 200° C. |
| Film-forming rate: | 0.01 nm/second to 1 nm/second |
| Pressure: | $10^{-5}$ Pa to $10^{-3}$ Pa |
| [Typical film-forming conditions] | |
| Support temperature: | 60° C. |
| Film-forming rate: | 0.05 nm/second |
| Pressure: | $1 \times 10^{-4}$ Pa |

[Step-140]

Thereafter, conductive particles 16 are formed as bridging the gaps among the islands of the semiconductor material layer 15 or serving as intermediaries of the islands. More particularly, under conditions where part of the gate electrode 12 and the source/drain electrodes 14 are covered with the hard mask, conductive particles 16 made of platinum (Pt) are formed on the semiconductor material layer 15 and the gate insulating layer 13 according to a sputtering method. In this way, a semiconductor layer 17 formed of a mixture of the semiconductor material layer 15 and the conductive particles 16 is obtained, and the semiconductor layer 17 constituting a channel-forming region 18 can be formed on the gate insulating layer 13. It will be noted that platinum is formed very thinly, so that the platinum is not formed actually as a thin film but as fine particles and is formed on and between the grains of pentacene (see the schematic plan view of FIG. 5B). For example, the forming conditions of the conductive particles 16 made of platinum by a sputtering method are those indicated in Table 2 below and the forming conditions by a vacuum deposition method are those indicated in Table 3 below.

TABLE 2

| Support temperature: | 30° C. |
|---|---|
| Pressure: | 0.5 Pa |
| RF power: | 100 W |

TABLE 3

| Support temperature | 60° C. |
|---|---|
| Pressure: | $1 \times 10^{-4}$ Pa |
| Forming rate: | 0.01 nm/second |

[Step-150]

Next, an insulating film 20 made of $SiO_2$ is formed over the entire surface, after which openings are formed in the insulating film 20 provided above the gate electrode 12 and the source/drain electrodes 14. A wiring material layer is formed on the insulating film 20 including the inside of the openings, followed by patterning of this wiring material layer to form a wiring 21A connected to the gate electrode 12, and wrings 21B, 21C connected to the source/drain electrodes 14 (FIG. 4). In this manner, FET of Embodiment 1 can be obtained.

It will be noted that in the method of manufacturing FET of Embodiment 1, the conductive particles 16 are formed on the gate insulating layer 13, after which the islands of the semiconductor material layer 15 may be formed so that the conductive particles 16 serve as intermediaries. In other words, the order of performing the [Step-130] and [Step-140] may be reversed.

In Embodiment 1, as shown in FIG. 5B, FET has such a structure that the conductive particles formed among the grains of pentacene and made of platinum allows electric, mutual connection of the grains. The transfer of carriers between the grains is likely to occur, thus ensuring the high-speed operation of FET.

Embodiment 2

Figure 6A:
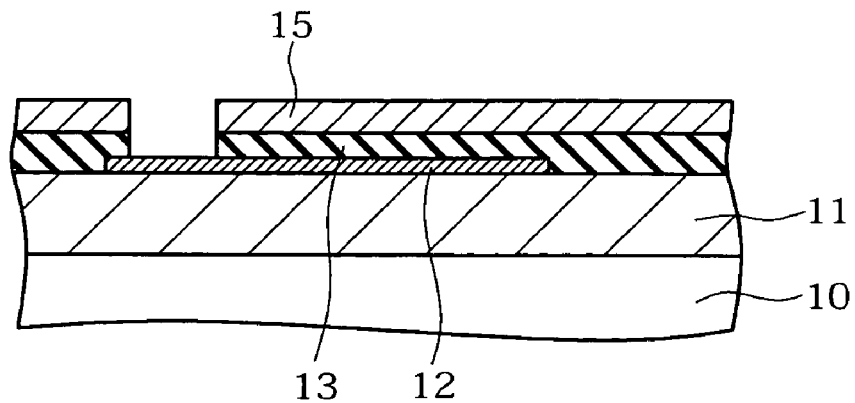
FIGS. 6A to 6C are, respectively, a schematic view, partially in section, of a support and other layers for illustrating a method of manufacturing a field effect transistor according to a second embodiment of the invention.
Figure 6B:
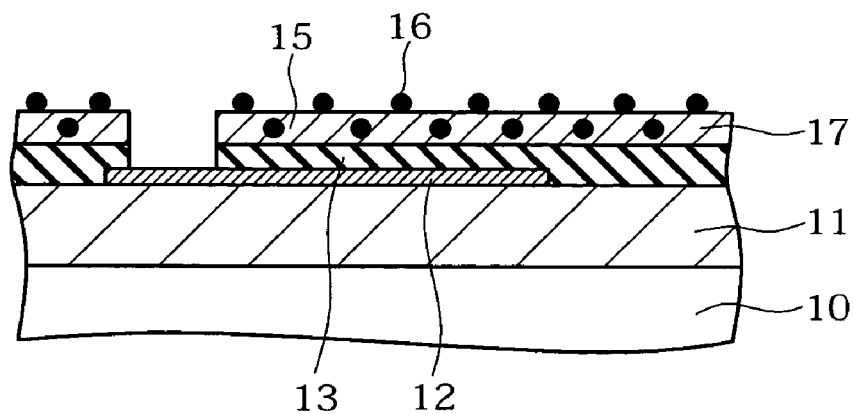
Figure 6C:
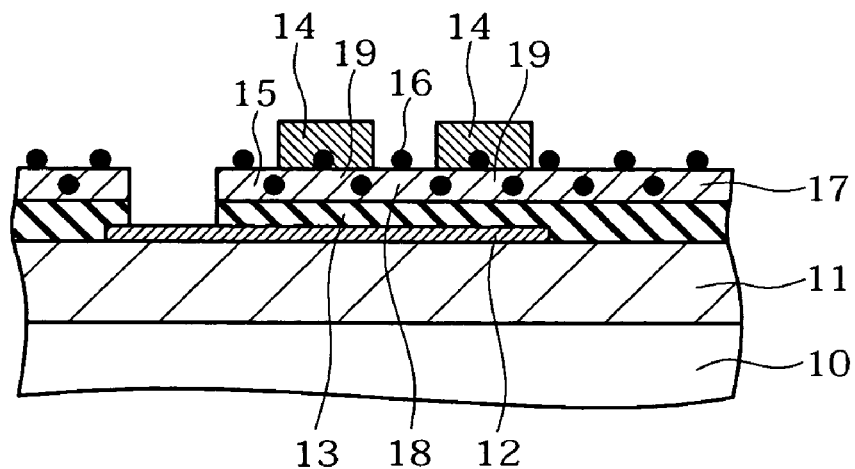

Embodiment 2 is a modification of the method of manufacturing FET according to Embodiment 1. In the FET of Embodiment 2, source/drain regions 19 are provided in the semiconductor layer 17 to sandwich the channel forming region 18 therebetween. Referring now to FIGS. 6A to 6C, which are, respectively, a schematic, partial section of a support and the like, a method of manufacturing FET of Embodiment 2 is described.

[Step-200]

Initially, according to a procedure similar to [Step-100] of Embodiment 1, a gate electrode 12 is formed on a substrate 11. Next, in the same manner as in [Step-110], a gate insulating layer 13 is formed on the substrate 11 including the surface of the gate electrode 12.

[Step-210]

Thereafter, in the same manner as in [Step-130] of Embodiment 1, islands of a semiconductor material layer 15 are formed on the gate insulating layer 13 (see FIG. 6A). More particularly, while part of the gate insulating electrode 12 is covered with a hard mask, an organic semiconductor material of pentacene is formed on the gate insulating layer 13 according to a vacuum deposition method. The forming conditions of the pentacene thin film are similar to those indicated in Table 1.

[Step-220]

Next, conductive particles 16 are formed so that they serve as intermediaries for the islands of the semiconductor material 15 in the same manner as in [Step-140] of Embodiment 1 (see FIG. 6B). More particularly, part of the gate electrode 12 is covered with the hard mask, under which the conductive particles 16 made of platinum (Pt) are formed in the semiconductor material layer 15 and the gate insulating layer 13. In this manner, the semiconductor layer 17 formed of a mixture of the semiconductor material layer 15 and the conducive particles 16 can be obtained, and thus the semiconductor layer 17 constituting a channel forming region 18 and the source/drain regions 19 can be formed. The forming conditions of the conductive particles 16 made of platinum are similar to those indicated in Tables 2 and 3.

[Step-230]

In the same manner as in [Step-120] of Embodiment 1, source/drain electrodes 14 are formed on the source/drain region 19 (see FIG. 6C).

[Step-240]

Thereafter, in the same manner as in [Step-150] of Embodiment 1, an insulating film made of SiO$_2$ is formed on the entire surface, after which openings are formed in the insulating film 20 provided above the gate electrode 12 and the source/drain electrodes 14. A wiring material layer is formed on the insulating film 20 including the inside of the openings, followed by patterning of this wiring material layer to form a wiring connected to the gate electrode 12 and wrings connected to the source/drain electrodes 14, thereby obtaining FET of Embodiment 2.

It will be noted that in the method of manufacturing FET of Embodiment 2, the conductive particles 16 are formed on the gate insulating layer 13, after which the islands of the semiconductor material layer 15 may be formed so that the conductive particles 16 serve as intermediaries for the islands. In other words, the order of performing the [Step-210] and [Step-220] may be reversed. In some case, [Step-230] may be omitted.

Embodiment 3

Embodiment 3 relates to a method for manufacturing FET according to a second embodiment of the invention. In FET of Embodiment 3, the source/drain regions 19 are formed in the semiconductor layer 17 so as to sandwich the channel forming region 18 therebetween. More particularly, FET of Embodiment 1 is a so-called top gate type of FET, as is particularly shown in FIG. 8 that is a schematic, partial section, which has the channel forming region 18 and the source/drain regions 19 formed in the semiconductor layer 17 and the gate electrode 12 provided in face-to-face relation with the channel forming region 18 via the gate insulating layer 13. The semiconductor layer 17 is made of a mixture of the semiconductor material layer 15 and the conductive particles 16. More particularly, as shown in the schematic plan view of FIG. 5B, the semiconductor material layer 15 is formed as islands, and the semiconductor layer 17 has a structure wherein the conductive particles 16 individually bridge the gaps among the islands of the semiconductor material layer 15. In Embodiment 3, the semiconductor material layer 15 is made of an organic semiconductor material, particularly, 2,3,6-7-dibenzoanthracene (which may also be called pentacene), and the conductive particles 16 are made of an inorganic material, partiuclarly, platinum (Pt).

The method of manufacturing FET of Embodiment 3 is described with reference to FIGS. 7A to 7D and FIG. 8, which are, respectively, a schematic, partial section of a support and the like.

Initially, a semiconductor layer 17 constituting at least a channel forming region (i.e. in Embodiment 3, a channel forming region 18 and source/drain regions 19 formed to sandwich the channel forming region 18 therebeween are constituted) is formed according to the procedures of [Step-300] and [Step-310] illustrated hereinbelow.

[Step-300]

Figure 7A:
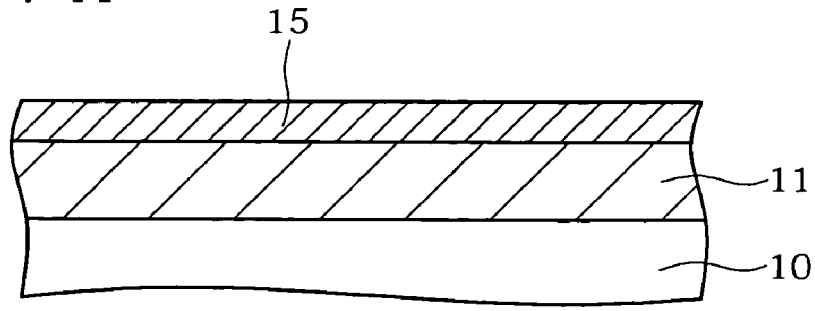
FIGS. 7A to 7D are, respectively, a schematic view, partially in section, of a support and other layers for illustrating a method of manufacturing a field effect transistor according to a third embodiment of the invention.

In particular, islands of a semiconductor material layer 15, which is made of an organic semiconductor material of pentacene, are formed on a polyether sulfone (PES) substrate 11, bonded to a support 10 made of a silicon substrate, according to a vacuum deposition method in the same manner as [Step-130] of Embodiment 1 (see FIG. 7A). The forming conditions of the pentacene thin film may be similar to those indicated in Table 1.

[Step-310]

Figure 7B:
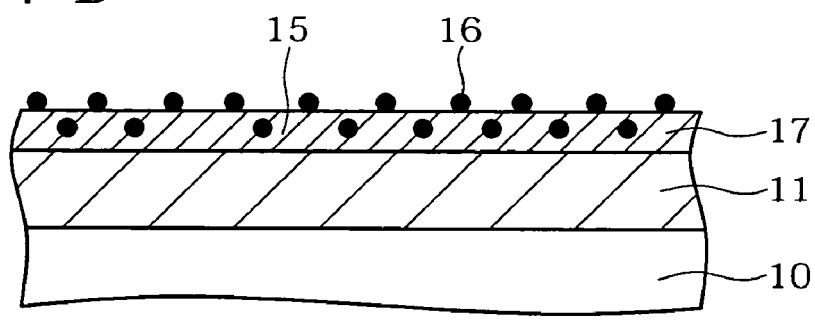

Next, in the same manner as in [Step-140] of Embodiment 1, conductive particles 16 made of platinum (Pt) are formed on the islands of the semiconductor material layer 15 and the substrate 11 according to a sputtering method so as to bridge the gaps among the islands of the semiconductor material layer 15 (see FIG. 7B). In this way, there can be obtained the semiconductor layer 17 which is made of a mixture of the semiconductor material layer 15 and the conductive particles 16, and the semiconductor layer 17 constituting the channel forming region 18 and the source/drain regions 19 can be formed on the substrate 11. The forming conditions of the conductive particles composed of platinum may be similar to those indicated in Table 2 or 3.

[Step-320]

Figure 7C:
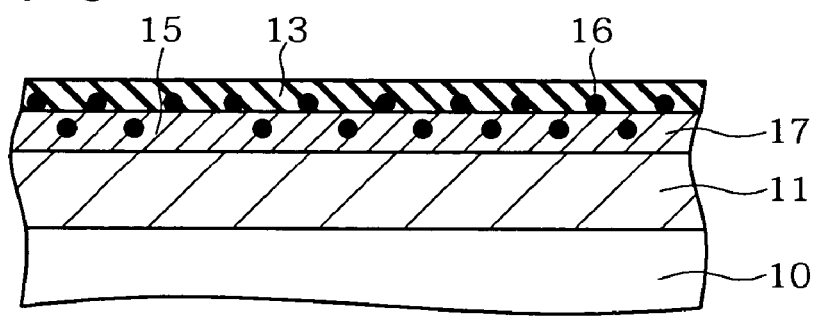

Next, a gate insulating layer is formed on the semiconductor layer 17. More particularly, like [Step-110] of Embodiment 1, a gate insulating layer 13 made of $SiO_2$ is formed on the semiconductor layer 17 according to a sputtering method (FIG. 7C).

[Step-330]

Figure 7D:
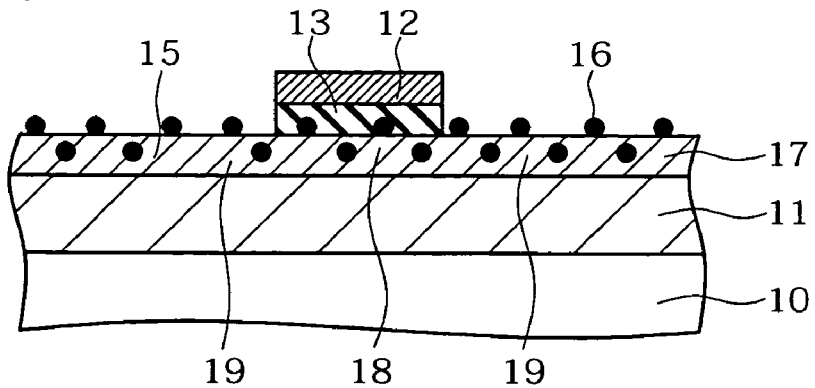

Thereafter, a gate electrode 12 is formed on the gate insulating layer 13 according to a procedure similar to [Step-100] of Embodiment 1, followed by removing the gate insulating film 13 from the source/drain regions 19 (see FIG. 7D).

[Step-340]

Figure 8:
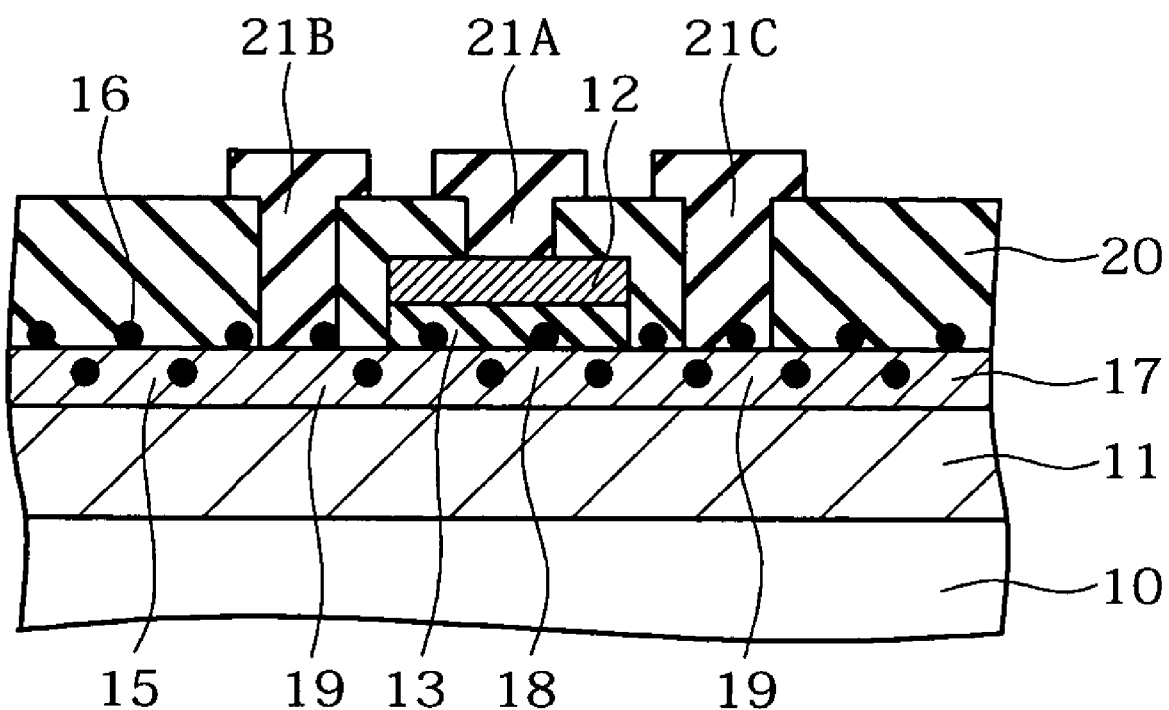
FIG. 8 is a schematic view, partially in section, of the support and other layers for illustrating the manufacturing method subsequent to FIG. 7D.

Next, an insulating film 20 made of $SiO_2$ is formed over the entire surface, after which openings are formed in the insulating film 20 provided above the gate electrode 12 and the source/drain regions 19. A wiring material layer is formed on the insulating film 20 including the inside of the openings, followed by patterning of this wiring material layer to form a wiring 21A connected to the gate electrode 12, and wrings 21B, 21C connected to the source/drain regions 19 (FIG. 8). In this manner, FET of Embodiment 3 can be obtained.

It will be noted that in the method of manufacturing FET of Embodiment 3, the conductive particles 16 are formed on the substrate 11, after which the islands of the semiconductor material layer 15 may be formed so that the conductive particles 16 serve as intermediaries therefor. In other words, the order of performing the [Step-300] and [Step-310] may be reversed.

The invention has been described based on the embodiments thereof, which should not be construed as limiting the invention thereto. In the embodiments, the conductive particles 16 have been constituted from platinum, and they may be constituted of an organic material or may be constituted of a mixture of an organic material and an inorganic material. The conductive particles may be formed not only by a sputtering method, but also by any of a vacuum deposition method, a chemical vapor deposition method, a spin coating method, a printing method and a spraying method. Moreover, the formation of the islands of a semiconductor material layer may be performed not only by a vacuum deposition method, but also by any of a sputtering method, a chemical vapor deposition method, a spin coating method, a printing method and a spraying method. For instance, the conditions where a semiconductor material layer is formed from PEDOT/PSS by a spin coating method includes those of 7000 rpm and 30 seconds.

Where the FET's of the invention are applied to and used in displays and various types of electronic appliances, a monolithic integrated circuit may be provided wherein a number of FET's may be integrally mounted on a substrate, or individual FET's may be cut into pieces for used as a discrete part.

The field effect transistor according to the invention includes a semiconductor layer which has a mixed structure of a semiconductor material layer and conductive particles, so that no limitation is placed on the mobility ascribed to the intermolecular electron transfer which has caused the low mobility of conventional organic semiconductor materials. Thus, the drastically higher carrier mobility can be obtained in comparison with the conventional organic semiconductor material, and therefore a field effect transistor capable of high-speed operations can be provided. No high temperature is necessary for the formation of a semiconductor layer, and in some cases, the semiconductor layer can be formed by a method, such as a spin coating method, a printing method or a spraying method without resorting to any vacuum techniques. Eventually, a field effect transistor can be fabricated on a flexible substrate, such as a plastic film, a plastic sheet, a plastic substrate or the like, at low costs. For instance, this field effect transistor may be integrally assembled into curved displays or electronic appliances.

What is claimed is:

1. A field effect transistor comprising:
    a channel forming region formed in a semiconductor layer, and
    a gate electrode provided in face-to-face relation with said channel forming region via a gate insulating layer,
    wherein said semiconductor layer is comprised of a mixture of a semiconductor material layer and conductive particles;
    wherein said semiconductor material layer is comprised of an organic semiconductor material; and
    wherein said conductive particles are comprised of a mixture of an organic material and an inorganic material.

* * * * *